(12) United States Patent
Hu

(10) Patent No.: US 10,770,678 B2
(45) Date of Patent: Sep. 8, 2020

(54) COVER FOR FLEXIBLE DISPLAY PANEL, FLEXIBLE DISPLAY PANEL AND METHOD FOR MANUFACTURING THE SAME

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventor: Yao Hu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/212,002

(22) Filed: Dec. 6, 2018

(65) Prior Publication Data

US 2019/0348629 A1    Nov. 14, 2019

(30) Foreign Application Priority Data

May 9, 2018 (CN) .......................... 2018 1 0437679

(51) Int. Cl.
*H01L 51/52* (2006.01)
*C03C 17/32* (2006.01)
(Continued)

(52) U.S. Cl.
CPC .......... *H01L 51/5246* (2013.01); *C03C 17/28* (2013.01); *C03C 17/32* (2013.01);
(Continued)

(58) Field of Classification Search
CPC ............... Y10T 428/19; Y10T 428/192; Y10T 428/195; Y10T 428/197; Y10T 428/198;
(Continued)

(56) References Cited

U.S. PATENT DOCUMENTS 5,059,476 A * 10/1991 Steiniger ............... A01K 1/0157
428/217
5,073,428 A * 12/1991 Lancelot ............ A47G 27/0206
428/120

(Continued)

*Primary Examiner* — David Sample
*Assistant Examiner* — Donald M Flores, Jr.
(74) *Attorney, Agent, or Firm* — Armstrong Teasdale LLP

(57) ABSTRACT

An embodiment of the present disclosure provides a cover for a flexible display panel, including an organic film including a recessed portion, a reinforcing layer disposed in the recessed portion, and a first and second rigid structure adjacent to each other disposed on the organic film, the first rigid structure includes a first joint portion, and the second rigid structure includes a second joint portion, the first joint portion and the second joint portion being configured to be separated from each other when the reinforcing layer is bent, and to be joined to form a one-piece structure when the reinforcing layer is not bent. In an embodiment of the present disclosure, by providing on the organic film a reinforcing layer and rigid structures that can be joined and separated, the cover may exhibit enhanced surface hardness, impact resistance and user's feel while the bending of the cover can be realized.

17 Claims, 6 Drawing Sheets

(51) Int. Cl.
*H01L 51/00* (2006.01)
*H01L 51/56* (2006.01)
*G02B 1/18* (2015.01)
*C03C 17/28* (2006.01)

(52) U.S. Cl.
CPC ............ *G02B 1/18* (2015.01); *H01L 51/0097* (2013.01); *H01L 51/56* (2013.01); *H01L 2251/5338* (2013.01); *H01L 2251/558* (2013.01); *Y10T 428/19* (2015.01); *Y10T 428/192* (2015.01); *Y10T 428/195* (2015.01); *Y10T 428/197* (2015.01); *Y10T 428/198* (2015.01); *Y10T 428/24* (2015.01); *Y10T 428/24025* (2015.01); *Y10T 428/2457* (2015.01); *Y10T 428/2462* (2015.01); *Y10T 428/24479* (2015.01); *Y10T 428/24587* (2015.01); *Y10T 428/24612* (2015.01); *Y10T 428/24752* (2015.01)

(58) Field of Classification Search
CPC ..... Y10T 428/24025; Y10T 428/24752; Y10T 428/24; Y10T 428/24479; Y10T 428/2457; Y10T 428/24612; Y10T 428/2462; Y10T 428/24587; H01L 51/5246; H01L 51/56; H01L 51/0097; H01L 2251/558; H01L 2251/5338; H01L 51/5237; H01L 51/52; H01L 27/3223; H01L 27/32; C03C 17/32; C03C 17/28; C03C 27/00; G02B 1/18
USPC .. 428/57, 58, 60, 61, 62, 101, 189, 98, 156, 428/167, 169, 172, 173
See application file for complete search history.

(56) References Cited

U.S. PATENT DOCUMENTS

| | | | |
|---|---|---|---|
| 8,075,971 B1* | 12/2011 | Horian | ...................... B32B 3/08 428/61 |
| 8,999,474 B2* | 4/2015 | Casteras | ................ B64G 1/222 16/221 |
| 2017/0183255 A1* | 6/2017 | Walther | .................. C03C 3/083 |
| 2017/0192462 A1* | 7/2017 | Kim | ....................... B32B 27/281 |
| 2018/0153328 A1* | 6/2018 | Girard | ............... E04F 15/02161 |
| 2018/0217639 A1* | 8/2018 | Jones | .................... H05K 1/0306 |
| 2020/0022267 A1* | 1/2020 | Han | .................... H01L 51/5246 |

* cited by examiner

COVER FOR FLEXIBLE DISPLAY PANEL, FLEXIBLE DISPLAY PANEL AND METHOD FOR MANUFACTURING THE SAME

CROSS REFERENCE TO RELATED APPLICATIONS

This patent application claims the benefit and priority of Chinese Patent Application No. 201810437679.9 filed on May 9, 2018, the disclosure of which is incorporated by reference herein in its entirety as part of the present application.

BACKGROUND

An embodiment of the present disclosure relates to the field of optical display devices, and particularly to a cover for flexible display panel, a flexible display panel, and a method of manufacturing the same.

At present, OLED (Organic Light-Emitting Diode) technology has seen increasingly wide application in products such as mobile phones, digital video cameras, laptop computers, televisions, etc. The flexible OLED technology has attracted extensive attention because its advantage of realizing a bendable OLED display device.

For bendable OLED display devices, a popular technology now is to provide a hardened layer type cover on a flexible OLED substrate. Although the hardened layer type cover exhibits good characteristics in bending, its surface hardness, impact resistance and user's feel are not as good as traditional glass cover.

BRIEF DESCRIPTION

An embodiment of the present disclosure addresses the problems in poor surface hardness, impact resistance, and user's feel of the hardened layer type cover disposed on the flexible OLED substrate in prior arts by providing a novel bendable cover, thereby obtaining a bendable cover with enhanced surface hardness, impact resistance and user's feel.

In order to solve the above problems, in one aspect, an embodiment of the present disclosure provides a cover for a flexible display panel, including an organic film including at least one recessed portion, a reinforcing layer disposed in the at least one recessed portion, and a first rigid structure and a second rigid structure adjacent to each other disposed on the organic film, the first rigid structure includes a first joint portion, and the second rigid structure includes a second joint portion, the first joint portion and the second joint portion being configured to be separated from each other when the reinforcing layer is bent, and to be joined to form a one-piece structure when the reinforcing layer is not bent.

In an embodiment of the present disclosure, the organic film is a polyimide (PI) film.

In an embodiment of the present disclosure, the recessed portion includes a plurality of recessed portions, each of the plurality of recessed portions is disposed at N-equal partition positions along a lengthwise direction of the organic film on a surface thereof facing the first rigid structure and the second rigid structure, wherein N≥2.

In an embodiment of the present disclosure, the recessed portions are disposed at a bisection position along a lengthwise direction of the organic film on a surface thereof facing the first rigid structure and the second rigid structure.

In an embodiment of the present disclosure, the organic film has a thickness in a range from about 100 μm to about 500 μm in the non-recessed portions, and a thickness in a range from about 30 μm to about 200 μm in the recessed portions.

In an embodiment of the present disclosure, the organic film and the reinforcing layer, and the organic film and the first and second rigid structures are bonded by an optically transparent adhesive.

In an embodiment of the present disclosure, two ends of the reinforcing layer are fixed to the first joint portion and the second joint portion being capable of being joined to each other to form a one-piece structure, respectively.

In an embodiment of the present disclosure, a hardened coating and an anti-fingerprint film are sequentially disposed on the surface of the reinforcing layer facing the first and second rigid structures.

In an embodiment of the present disclosure, the first joint portion and the second joint portion are joined to each other to form a one-piece structure by meshing. In an embodiment of the present disclosure, the opposite surfaces of the first joint portion and the second joint portion include mutually cooperating multi-arcuate-shaped structures or serrated structures.

In an embodiment of the present disclosure, a refractive index of the recessed portion of the organic film gradually increases from both ends of the recessed portion of the organic film adjacent to the reinforcing layer to a median line of the recessed portion of the organic film. The refractive index of the reinforcing layer gradually increases from both ends to the median line of the reinforcing layer, and the refractive index of the one-piece structure formed by the first joint portion and the second joint portion gradually increases from both ends to the median line of the one-piece structure.

In an embodiment of the present disclosure, a plurality of nanometer-sized holes are disposed in the reinforcing layer and in the recessed portion of the organic film, and the intervals between the holes in the same row along the lengthwise direction of the organic film decrease from both ends to the middle.

In an embodiment of the present disclosure, the reinforcing layer has a thickness in a range from about 70 μm to about 300 μm.

In an embodiment of the present disclosure, the first rigid structure and the second rigid structure have a thickness in a range from about 300 μm to about 500 μm.

In an embodiment of the present disclosure, the material of the reinforcing layer includes ultra-thin glass.

In an embodiment of the present disclosure, the material of the first rigid structure and the second rigid structure includes glass.

An embodiment of the present disclosure further provides a flexible display panel, wherein the flexible display panel includes the flexible OLED substrate and a cover for the above flexible display panel provided by the embodiment of the present disclosure, wherein the organic film is disposed on the flexible OLED substrate.

An embodiment of the present disclosure further provides a method of manufacturing the cover for a flexible display panel, the method including producing a reinforcing layer by tape casting and mechanical grinding, connecting two ends of a first surface of the reinforcing layer to the surfaces of the first rigid structure and the second rigid structure capable of being joined and separated by means of glass microcrystalline welding, respectively, so that the first rigid structure and the second rigid structure are capable of being joined and separated above the reinforcing layer, inverting the first rigid structure and the second rigid structure welded with the reinforcing layer such that a second surface of the reinforcing layer opposite the first surface faces upward, coating a liquid organic material on the second surface of the reinforcing layer and the surfaces of the first rigid structure and the second rigid structure by slit die coating, to make the liquid organic material coated on the second surface of the reinforcing layer flush with liquid organic material coated on the surfaces of the first rigid structure and the second rigid structure during the coating process, and curing the liquid organic material to form an organic film attached to the second surface of the reinforcing layer and the surfaces of the first rigid structure and the second rigid structure.

In an embodiment of the present disclosure, the material of the reinforcing layer includes ultra-thin glass.

In an embodiment of the present disclosure, the material of the first rigid structure and the second rigid structure includes glass.

The cover for a flexible display panel provided in an embodiment of the present disclosure has at least the following advantages: improving the surface hardness, impact resistance as well as user's feel of the cover while bending the cover by arranging a reinforcing layer and rigid structures that can be joined and separated on the organic film.

DETAILED DESCRIPTION

The following is an illustration of a bendable cover, a bendable OLED display device, and a method for manufacturing the bendable cover according to embodiments of the present disclosure with reference to the drawings. A great number of specific details are illustrated below to allow those skilled in the art to appreciate the embodiments of the present disclosure. However, it will be apparent to those skilled in the art that the implementation of the embodiments of the present disclosure may be done without some of these specific details. In addition, it should be understood that the embodiments of the present disclosure are not limited to the illustrated particular embodiments. Instead, the present disclosure may be carried out with any combination of the following features and elements, whether or not they relate to different embodiments. Therefore, the following aspects, features, embodiment, and advantages are only intended for illustration but shall not be considered as elements or limitations to the claims unless otherwise specified in the claims.

Figure 1:
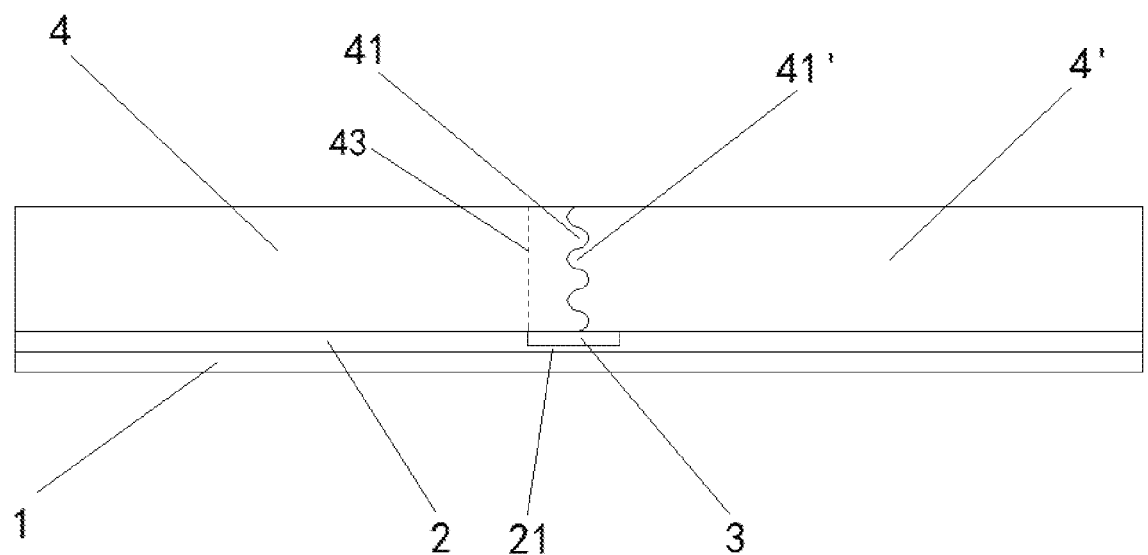
FIG. 1 shows a bendable OLED display device in a non-bent state according to an embodiment of the present disclosure.
Figure 2:
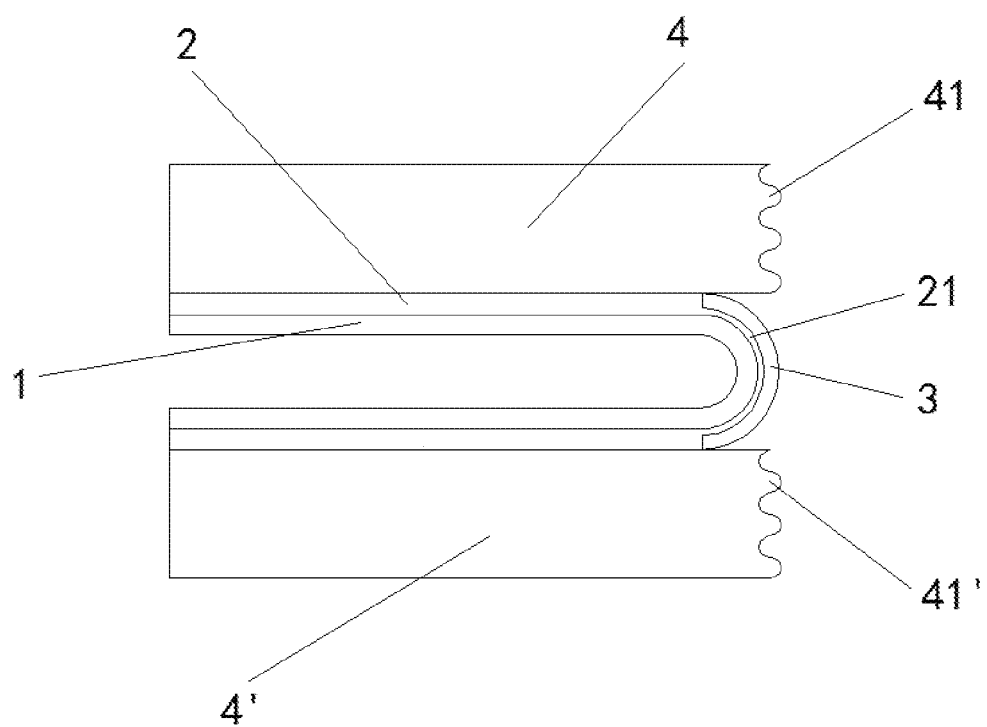
FIG. 2 shows a bendable OLED display device in a bent state according to an embodiment of the present disclosure.

FIGS. 1 and 2 illustrate a bendable OLED display device provided by an embodiment of the present disclosure, wherein the OLED display device in FIG. 1 is in a non-bent state, and the OLED display device in FIG. 2 is in a bent state. The bendable OLED display device of the embodiment of the present disclosure includes a flexible OLED substrate 1 on which an OLED illuminator is disposed, an organic film 2 disposed on the flexible OLED substrate 1 and including a recessed portion 21, wherein the organic film 2 may be a PI film, a reinforcing layer 3 disposed in the recessed portion 21 of the organic film 2, the reinforcing layer 3 being bendable because of excellent flexibility, wherein the reinforcing layer 3 may be an ultra-thin glass, a first rigid structure 4 including a first joint portion and a second rigid structure 4' including a second joint portion, the first joint portion and the second joint portion being separated when the organic film 2 is bent, and being jointed to each other to form a one-piece structure when the organic film 2 is not bent. The first rigid structure 4 and the second rigid structure 4' may be glass cover plates, and those skilled in the art may understand that the first rigid structure 4 and the second rigid structure 4' may also be embodied as other transparent rigid structures. These variants do not depart from the protection scope of the present disclosure, wherein, the organic film 2, the reinforcing layer 3, the first rigid structure 4, and the second rigid structure 4' form the bendable cover in the present disclosure.

Aside from the PI film, those skilled in the art may also consider other types of organic films, such as PET (poly (ethylene terephthalate)) films.

By way of providing the reinforcing layer 3, the first rigid structure 4, and the second rigid structure 4' which can be joined and separated from each other on the organic film 2 above the flexible OLED substrate 1, the OLED display device will present enhanced surface hardness, impact resistance and user's feel while the bending of the OLED display device can be realized.

In an embodiment disclosed in FIGS. 1 and 2 of the present disclosure, the recessed portion 21 is located at a central position of the organic film 2, and accordingly, the first joint portion of the first rigid structure 4 and the second joint portion of the second rigid structure 4' are also located at the central position of the entire OLED display device. Thereby, the OLED display device can be bent at the central position. Those skilled in the art that can understand that the recessed portion 21 may be disposed at a position offset from the median line according to actual needs, for example, at a position close to both ends of the organic film 2, and accordingly, the first joint portion of the first rigid structure 4 and the second joint portion of the second rigid structure 4' are also located close to both ends of the OLED display device, such that the OLED display device can be bent at a position offset from the median line. The recessed portion 21 may be disposed at equal partition positions of the organic film, for example at each of the trisection positions or at each of the quartered positions. These variations do not depart from the protection scope of the present disclosure.

In addition, those skilled in the art can understand that a plurality of recessed portions 21 may be disposed at different positions of the organic film 2 according to actual needs, and accordingly a plurality of reinforcing layers 3 may be disposed in the plurality of recessed portions 21, and correspondingly a plurality of glass cover plates may be arranged, such that the OLED display device can be bent at a plurality of positions. These variants do not depart from the protection scope of the present disclosure.

The recessed portion 21 may be produced in the organic film 2, for example by optical etching, which recessed portion may be a rectangular recessed portion such that the reinforcing layer 3 may be arranged therein.

The organic film 2 may have a thickness in a range from about 100 μm to about 500 μm at non-recessed portion, and a thickness in a range from about 30 μm to about 200 μm at recessed portion, and the reinforcing layer 3 may have a thickness in a range from about 70 μm to about 300 μm, the first rigid structure 4 and the second rigid structure 4' may have a thickness in a range from about 300 μm to about 500 μm.

The optical film 2 and the reinforcing layer 3, and the organic film 2 and the rigid structures 4 and 4', respectively, are bonded by an optically transparent adhesive, thereby bonding the organic film 2 with the reinforcing layer 3, and bonding the organic film 2 with the rigid structures 4 and 4'. The optically transparent adhesive may be, for example, PSA or OCA.

Both ends of the reinforcing layer 3 may be fixedly connected to the first rigid structure 4 and the second rigid structure 4', respectively.

A hardened coating and an anti-fingerprint film are sequentially disposed on the surface of the reinforcing layer 3 facing the first rigid structure 4 and the second rigid structure 4'. The hardened coating can reduce the damage affecting the display effect caused by friction between the surface of the reinforcing layer 3 and the first rigid structure 4 and the second rigid structure 4'. The anti-fingerprint film can reduce the influence of the stain on the user's finger on the display effect. The hardened coating may be used as a scratch resistant coating if it is tightly bonded to the surface of the reinforcing layer and not vulnerable to peeling off.

The first rigid structures 4 and the second rigid structure 4' are joined in a meshing manner. Specifically, FIGS. 1 and 2 show that the opposite surfaces of the first rigid structure 4 and the second rigid structure 4' respectively include the first joint portion 41 and the second joint portion 41' which can cooperate with each other. The first joint portion 41 and the second joint portion 41' are complementary in shape and can be meshed with each other. In the bent state, the first rigid structure 4 and the second rigid structure 4' are separated from each other. In the non-bent state, the first rigid structure 4 and the second rigid structure 4' are meshed together by the first joint portion 41 and the second joint portion 41' which cooperate with each other. The first rigid structure 4 and the second rigid structure 4' are connected by meshing, which can reduce bad influence on the display effect by the joint of the two first rigid structures 4 and the second rigid structure 4'.

Figure 3:
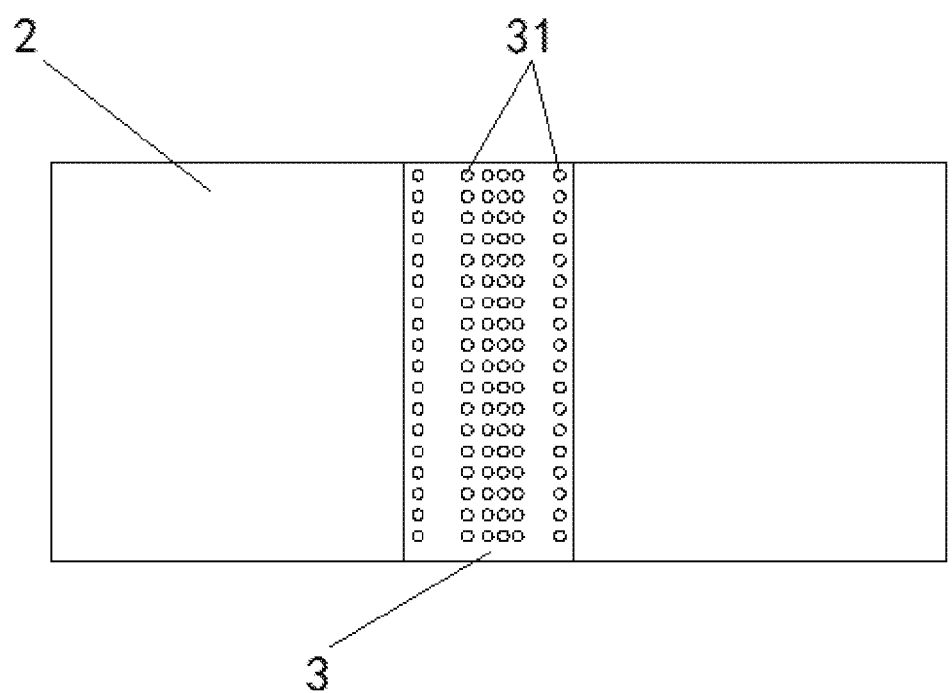
FIG. 3 shows holes disposed in a reinforcing layer of a bendable OLED display device according to an embodiment of the present disclosure.

As shown in FIG. 3, the reinforcing layer 3 of the OLED display device is provided with a plurality of holes 31. The recessed portions of the organic film 2 may be provided with holes (not shown) that are in one-to-one correspondence with the holes 31 in the reinforcing layer 3, the hole diameter is nanometer-sized. Furthermore, the intervals between the holes 31 in the same row along the direction across the two ends of the recessed portion 21 adjacent to the reinforcing layer 3 (i.e., along the lengthwise direction of the organic film 2) gradually decrease from the two ends to the middle. These holes in the reinforcing layer 3 and the recessed portions of the organic film 2 are capable of reducing bad influence on the display effect caused by the light passing through the multi-interface region (PI film+ultra-thin glass+ glass cover plate) in the non-bent state. Specifically, since these holes can increase the light transmitting rate, the center of the reinforcing layer show the strongest image brightness and the image brightness is gradually darkened towards two ends. The holes arranged in the reinforcing layer 3 and the organic film 2 may be through holes, thereby further increasing the light transmitting rate. Therefore, in the non-bent state, these holes allow for smooth transition of the image brightness from the multi-interface area (PI film+ultra-thin glass+glass cover plate) to the normal display area (PI film+glass cover plate), to weaken the boundary between the multi-interface area and the normal display area.

The refractive index of the recessed portion 21 of the organic film 2 gradually increases from both ends of the recessed portion 21 adjacent to the reinforcing layer 3 to the median line of the recessed portion 21. The refractive index of the reinforcing layer 3 gradually increases from both ends to the median line of the reinforcing layer 3. Further, in the non-bent state, the refractive index of the one-piece structure formed by the bonding of the first rigid structure 4 and the second rigid structure 4' above the reinforcing layer 3 gradually increases from both ends to the median line of the one-piece structure. For example, with respect to the first rigid structure 4, its refractive index gradually increases in a direction from the dotted line 43 in FIG. 1 to the interface where the first joint portion 41 and the second joint portion 41' are bonded to each other. Therefore, the light of the multi-interface area is deflected from the median line to both sides in the non-bent state, thereby avoiding abnormal display of the multi-interface area caused by over brightness of the images in the central portion of the multi-interface area. As shown in FIGS. 1 and 2, both the first joint portion 41 and the second joint portion 41' may have multi-arcuate structure.

Figure 4:
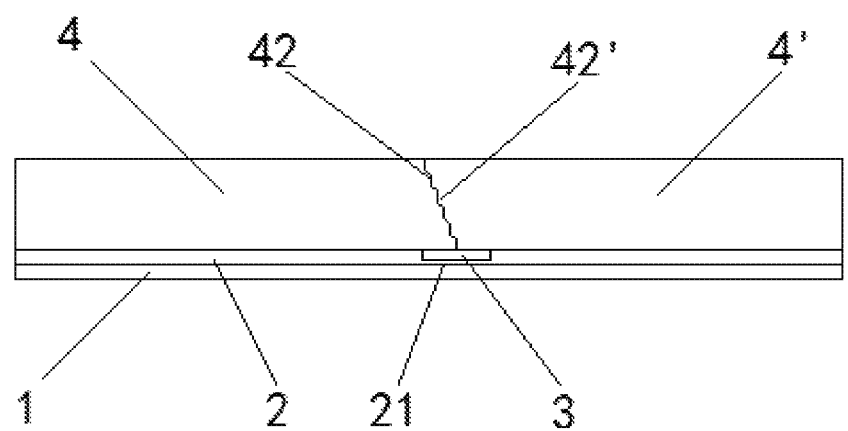
FIG. 4 shows a bendable OLED display device in a non-bent state according to another embodiment of the present disclosure.
Figure 5:
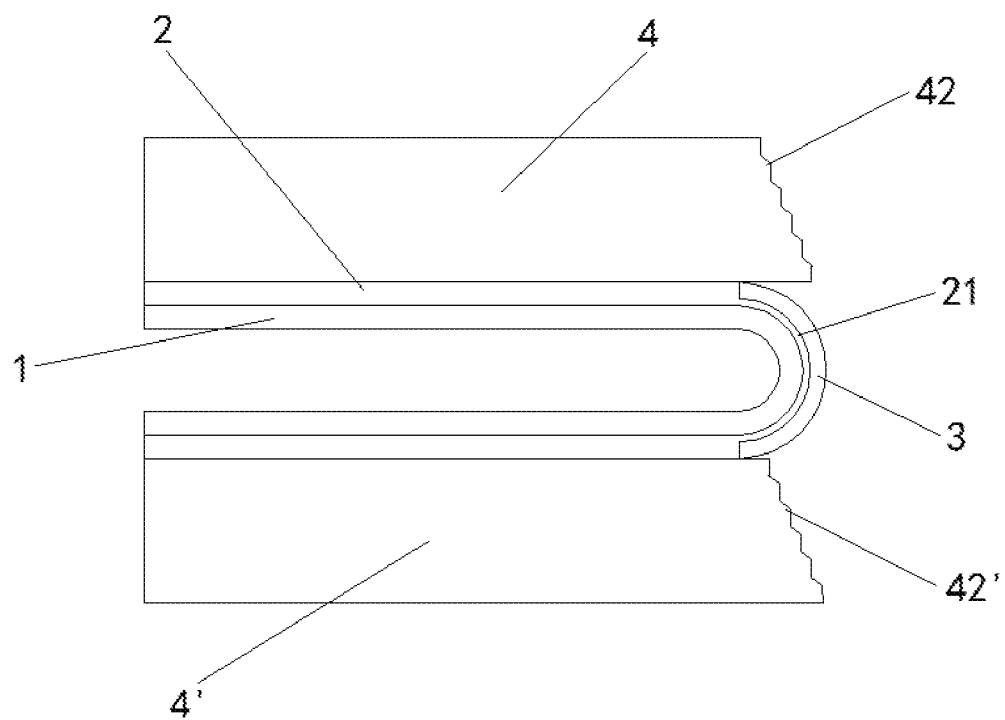
FIG. 5 shows a bendable OLED display device in a bent state according to another embodiment of the present disclosure.

FIGS. 4 and 5 illustrate a bendable OLED display device in accordance with another embodiment of the present disclosure, wherein, the OLED display device in FIG. 4 is in a non-bent state, and the OLED display device in FIG. 5 is in a bent state.

The bendable OLED display device in another embodiment of the present disclosure illustrated in FIGS. 4 and 5 has substantially the same elements as the bendable OLED display device in the embodiment of the present disclosure illustrated in FIGS. 1-3, except that the first rigid structure 4 and the second rigid structure 4' in the embodiment shown in FIGS. 4 and 5 are meshed by the first joint portion 42 and the second joint portion 42' that cooperate with each other. As shown in FIGS. 4 and 5, both the first joint portion 42 and the second joint portion 42' may have serrated structure.

It will be understood by those skilled in the art that although FIGS. 1-5 illustrate the use of multi-arcuate structure or serrated structure to join and separate the glass cover plate. However, other structures may be used by those skilled in the art to realize the meshed connection between the glass cover plates according to actual needs, such as a bevel structure, etc. These variants do not depart from the protection scope defined by the embodiments of the present disclosure.

Figure 6:
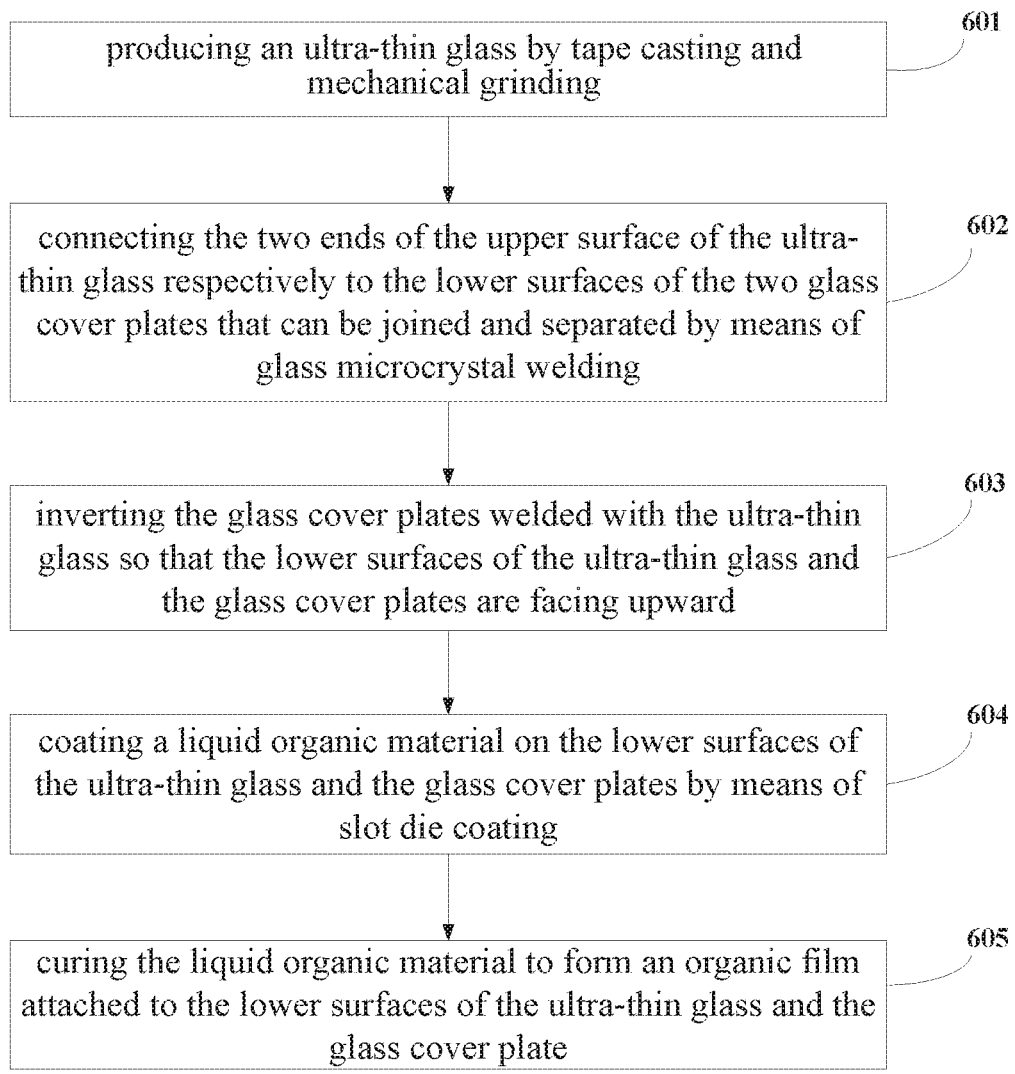
FIG. 6 shows a flow chart of a method for manufacturing a bendable cover according to an embodiment of the present disclosure.

FIG. 6 shows a flow chart of a method for manufacturing the bendable cover provided by the embodiment of the present disclosure. As shown in FIG. 6, the method includes the following steps:

Step 601: producing an ultra-thin glass by tape casting and mechanical grinding. Specifically, the thickness of the glass can be controlled by tape casting during the process of cooling a molten liquid glass. The glass is mechanically ground after formation to produce an ultra-thin glass with a desired thickness. Then, the ultra-thin glass can be placed in molten $A_2NO_3$ (wherein A is an alkali metal such as Li, Na, K, and etc.) for the purpose of surface strengthening. Finally, an upper surface of the ultra-thin glass may be coated with a film (for example, anti-reflection film (AR film) and anti-fingerprint film (AF film)) to improve the optical and physical properties of the ultra-thin glass.

Step 602: connecting the two ends of the upper surface of the ultra-thin glass respectively to the lower surfaces of the two glass cover plates that can be joined and separated by means of glass microcrystal welding, so that the two glass cover plates can be joined and separated above the ultra-thin glass.

Step 603: inverting the glass cover plates welded with the ultra-thin glass so that the lower surfaces of the ultra-thin glass and the glass cover plates are facing upward.

Step 604: coating a liquid organic material (for example, liquid PI) on the lower surfaces of the ultra-thin glass and the glass cover plates by means of slot die coating, to make the liquid organic material coated on the lower surface of the ultra-thin glass flush with the liquid organic material coated on the glass cover plates during the coating process.

Step 605: curing the liquid organic material to form an organic film attached to the lower surfaces of the ultra-thin glass and the glass cover plate.

The bendable cover provided by the embodiment of the present disclosure can be manufactured by the above method, but it can be manufactured by those skilled in the art with other suitable production processes according to actual needs.

Although the present disclosure has been disclosed above in the example embodiments, it is not limited to this. Any variations and modifications made by those skilled in the art without departing from the spirit and scope of the disclosure should be encompassed within the scope of the disclosure, and therefore the protection scope of the disclosure should be defined by the scope defined by the claims.

What is claimed is:

1. A cover for a flexible display panel, the cover comprising:
    an organic film including a recessed portion;
    a reinforcing layer disposed in the recessed portion; and
    a first rigid structure and a second rigid structure adjacent to each other disposed on the organic film, wherein the first rigid structure includes a first joint portion, wherein the second rigid structure includes a second joint portion, and wherein the first joint portion and the second joint portion are configured to be separated from each other when the reinforcing layer is bent, and to be joined to form a one-piece structure when the reinforcing layer is not bent, the first rigid structure and the second rigid structure are transparent.

2. The cover according to claim 1, wherein the organic film is a polyimide film.

3. The cover according to claim 1, wherein the recessed portion comprises a plurality of recessed portions, each of the plurality of recessed portions disposed at N-equal partition positions along a lengthwise direction of the organic film on a surface of the organic film facing the first rigid structure and the second rigid structure respectively, wherein N>2.

4. The cover according to claim 1, wherein the recessed portion is disposed at a bisection position along a lengthwise direction of the organic film on a surface of the organic film facing the first rigid structure and the second rigid structure.

5. The cover according to claim 1, wherein the organic film has a thickness in a range from about 100 μm to about 500 μm in the non-recessed portion, and a thickness in a range from about 30 μm to about 200 μm in the recessed portion.

6. The cover according to claim 1, wherein the organic film and the reinforcing layer are bonded by optically transparent adhesive, and wherein the organic film and the first and second rigid structures are bonded by optically transparent adhesive.

7. The cover according to claim 1, wherein two ends of the reinforcing layer are fixed to the first joint portion and the second joint portion, respectively.

8. The cover according to claim 1, wherein a hardened coating and an anti-fingerprint film are sequentially disposed on a surface of the reinforcing layer facing the first and second rigid structures.

9. The cover according to claim 1, wherein the first joint portion and the second joint portion can be joined to each other to form a one-piece structure in a meshing manner.

10. The cover according to claim 9, wherein opposite surfaces of the first joint portion and the second joint portion comprise mutually cooperating multi-arcuate-shaped structures or serrated structures.

11. The cover according to claim 1, wherein the refractive index of the recessed portion of the organic film gradually increases from both ends of the recessed portion of the organic film adjacent to the reinforcing layer to a median line of the recessed portion of the organic film, wherein the refractive index of the reinforcing layer gradually increases from both ends to the median line of the reinforcing layer, and wherein the refractive index of the one-piece structure formed by the first joint portion and the second joint portion gradually increases from both ends to the median line of the one-piece structure.

12. The cover according to claim 1, wherein a plurality of nanometer-sized holes are disposed in the reinforcing layer and in the recessed portion of the organic film, and wherein the distance between the holes in the same row along the lengthwise direction of the organic film gradually decrease from both ends to the middle.

13. The cover according to claim 1, wherein the reinforcing layer has a thickness in a range from about 70 μm to about 300 μm.

14. The cover according to claim 1, wherein the first rigid structure and the second rigid structure have a thickness in a range from about 300 μm to about 500 μm.

15. The cover according to claim 1, wherein the material of the reinforcing layer comprises ultra-thin glass.

16. The cover according to claim 1, wherein the material of the first rigid structure and the second rigid structure comprises glass.

17. A flexible display panel, wherein the flexible display panel comprises a flexible organic light emitting diode (OLED) substrate and the cover according to claim 1, and wherein the organic film is disposed on the flexible OLED substrate.

* * * * *

UNITED STATES PATENT AND TRADEMARK OFFICE
CERTIFICATE OF CORRECTION

PATENT NO. : 10,770,678 B2  
APPLICATION NO. : 16/212002  
DATED : September 8, 2020  
INVENTOR(S) : Yao Hu Page 1 of 1

It is certified that error appears in the above-identified patent and that said Letters Patent is hereby corrected as shown below:

In the Claims

In Claim 3, Column 7, Lines 53-54, delete "wherein $N>2$" and insert therefor -- wherein $N \geq 2$ --

Signed and Sealed this  
Twentieth Day of October, 2020

Andrei Iancu  
*Director of the United States Patent and Trademark Office*